United States Patent [19]

Akimoto

[11] Patent Number: 5,668,053
[45] Date of Patent: Sep. 16, 1997

[54] METHOD FOR FABRICATING MULTILAYER SEMICONDUCTOR DEVICE

[75] Inventor: Takeshi Akimoto, Tokyo, Japan

[73] Assignee: NEC Corporation, Tokyo, Japan

[21] Appl. No.: 364,316

[22] Filed: Dec. 27, 1994

[30] Foreign Application Priority Data

Dec. 28, 1993 [JP] Japan .................. 5-336648

[51] Int. Cl.[6] .................................. H01L 21/44
[52] U.S. Cl. .................. 438/625; 438/636; 438/643; 438/648
[58] Field of Search .................. 437/190, 195, 437/192; 156/657.1

[56] References Cited

U.S. PATENT DOCUMENTS

| | | | |
|---|---|---|---|
| 4,410,622 | 10/1983 | Dalal et al. | 430/312 |
| 5,449,639 | 9/1995 | Wei et al. | 437/187 |
| 5,451,543 | 9/1995 | Woo et al. | 437/195 |

FOREIGN PATENT DOCUMENTS

| | | |
|---|---|---|
| 0326204 | 8/1989 | European Pat. Off. . |
| 62017190 | 1/1987 | Japan . |
| 62132359 | 6/1987 | Japan . |
| 62-132359 | 6/1987 | Japan . |
| 4099385 | 3/1992 | Japan . |
| 2260643 | 4/1993 | United Kingdom . |

OTHER PUBLICATIONS

Wolf, S.; Silicon Processing for the VLSI Era; Lattice Press; p. 441 1986.

*Primary Examiner*—R. Bruce Breneman
*Assistant Examiner*—Julie E. Stein
*Attorney, Agent, or Firm*—Foley, Hoag & Eliot, LLP

[57] ABSTRACT

A method for fabricating a multilayer semiconductor device according to the invention includes the steps of providing a conductive layer on a substrate; forming a barrier layer on the first conductive layer; forming an insulation layer on the barrier layer; selectively etching the insulation layer using the barrier layer as a stopper to form a through-hole; and selectively removing the barrier layer at the bottom of the through-hole from the conductive layer.

13 Claims, 6 Drawing Sheets

5,668,053

1

METHOD FOR FABRICATING MULTILAYER SEMICONDUCTOR DEVICE

FIELD OF THE INVENTION

The invention relates to a method for fabricating a multilayer semiconductor device, especially to a method for forming a through-hole in such a device.

BACKGROUND OF THE INVENTION

For high integration of semiconductor devices, through-holes are important to be formed well. Those through-holes are formed to connect multilayered conductive layers on different levels.

In fabrication of a conventional semiconductor device, a barrier layer with low reflection rate is formed on a conductive layer, an insulation layer is formed on the barrier layer, and then the insulation layer is etched to form through-holes. In this processing, the barrier layer is not etched. Usually, aluminum and its alloy is used as the conductive layer, however, aluminum has a high reflection rate which is bad for lithography processing, that is, aluminum layer makes resolution of lithography processing lower and patterning process worse. That is why the barrier layer which has a low reflection rate, such as TiN having a thickness of hundreds Å, is necessary to be formed on the aluminum layer. According to this kind of fabrication processing, the barrier layer makes conduction characteristic between the through-holes and the conductive layer low, because the barrier layer usually has a high insulation rate. On the other hand, if the barrier layer is also etched in the formation of through-holes, pieces of the conductive layer (deposits) are stuck on the inside surface of the through-holes, and therefore, electrical characteristics and quality of the through-holes become worse.

In fabrication of another conventional semiconductor device, a barrier layer with low reflection rate is formed on a conductive layer, a cap-layer such as tungsten (W) is formed on the barrier layer, an insulation layer is formed on the cap-layer, and then the insulation layer and the cap layer are etched to form through-holes. This conventional technique has the same problems as the above mentioned another conventional technique.

SUMMARY OF THE INVENTION

Accordingly an object of the invention is to provide an improved method for fabricating a multilayer semiconductor device by which high quality through-holes can be formed therein. That is, the through-holes are connected to conductive layers with low resistance.

According to the invention, a method for fabricating a multilayer semiconductor device includes the following steps:

(1) providing a conductive layer on a substrate;

(2) forming a barrier layer on the conductive layer;

(3) forming an insulation layer on the barrier layer;

(4) selectively etching the insulation layer using the barrier layer as a stopper to form a through-hole therein; and (5) selectively removing the barrier layer at the bottom of the through-hole from the conductive layer.

2

Figure 3A:
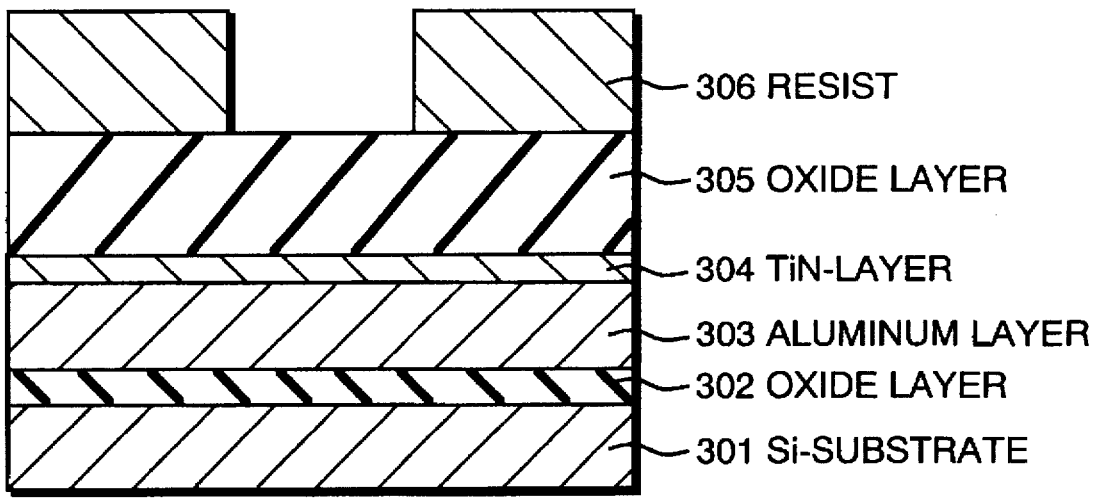
Figure 3B:
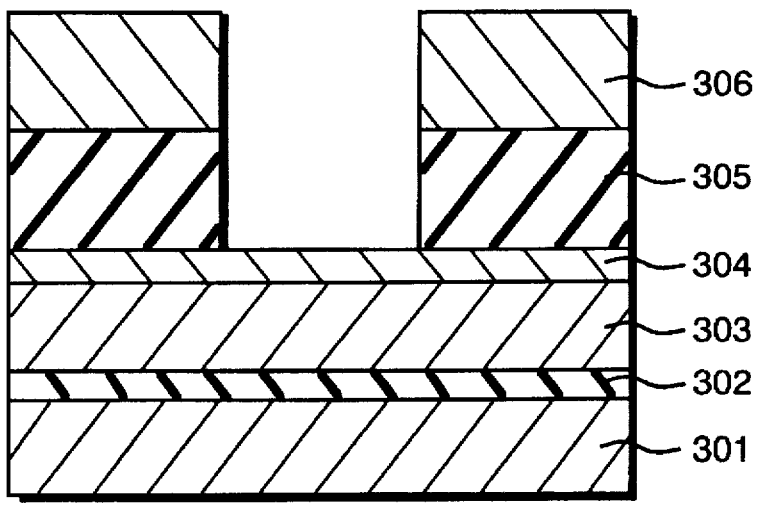
Figure 3C:
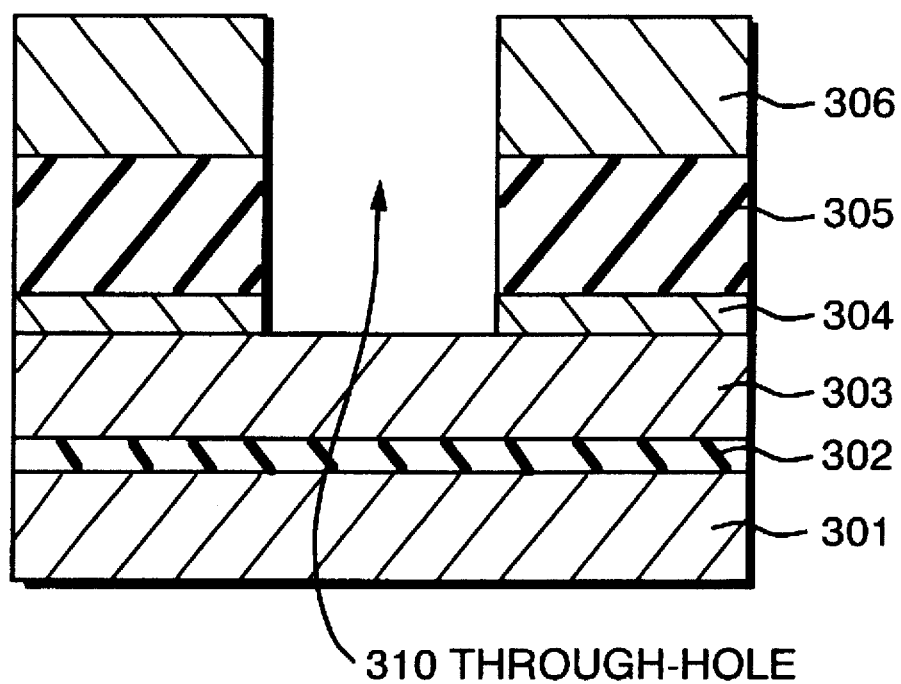

FIGS. 3A to 3C are cross-sectional views showing fabrication process of a first preferred embodiment according to the invention.

Figure 4A:
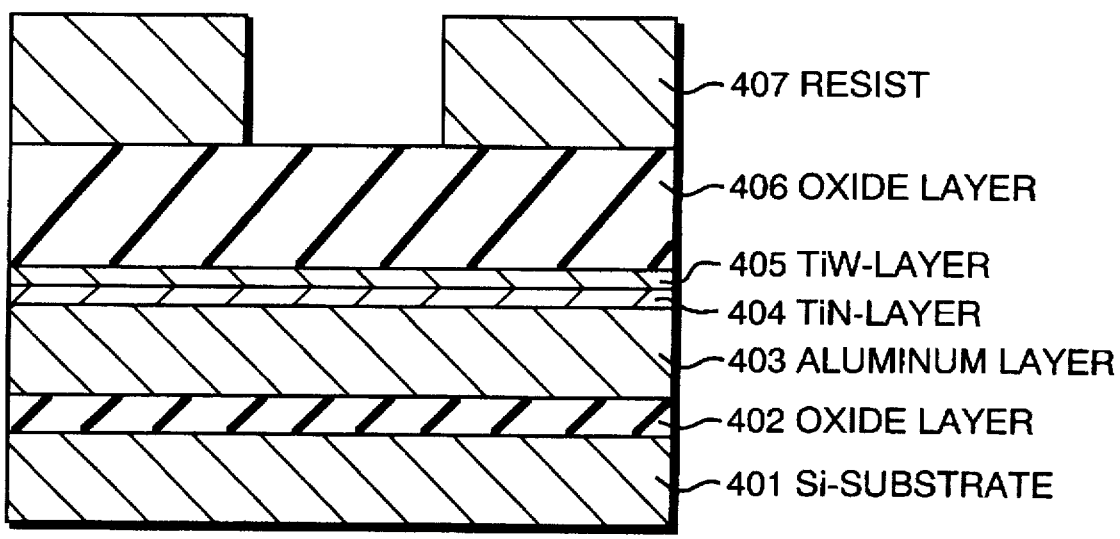
Figure 4B:
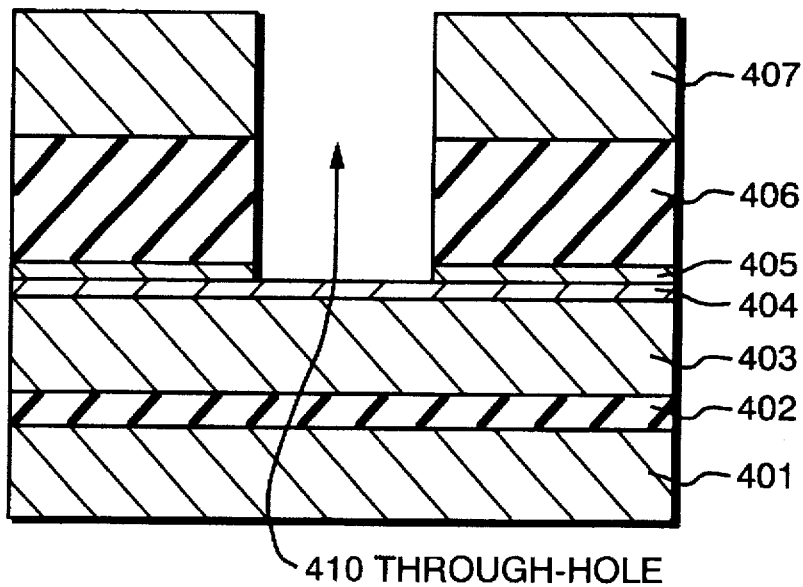
Figure 4C:
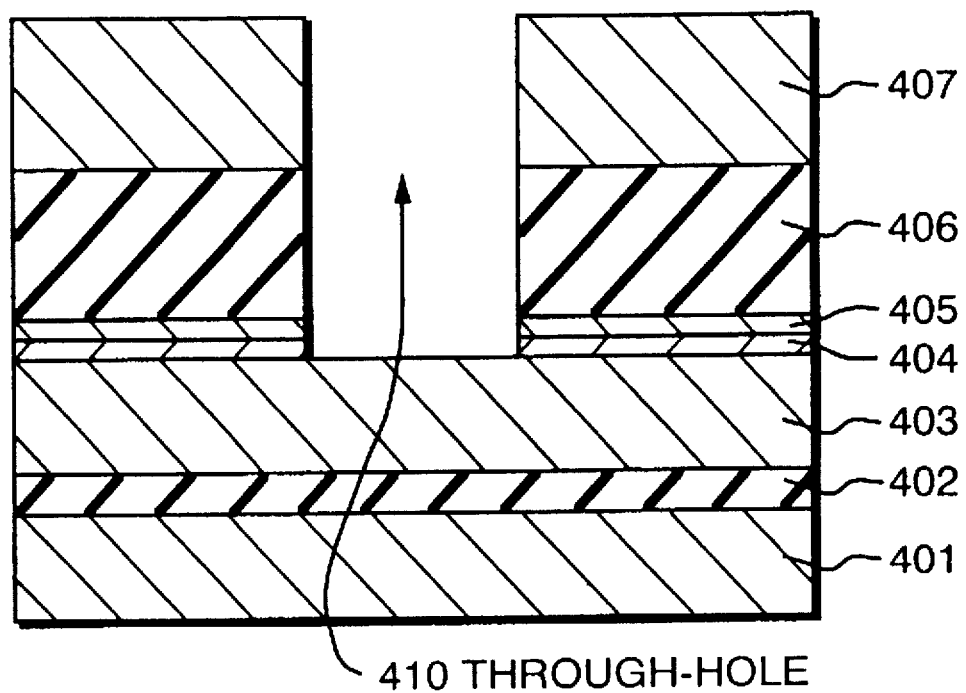

FIGS. 4A to 4C are cross-sectional views showing fabrication process of a second preferred embodiment according to the invention.

DESCRIPTION OF THE PREFERRED EMBODIMENTS

Figure 1A:
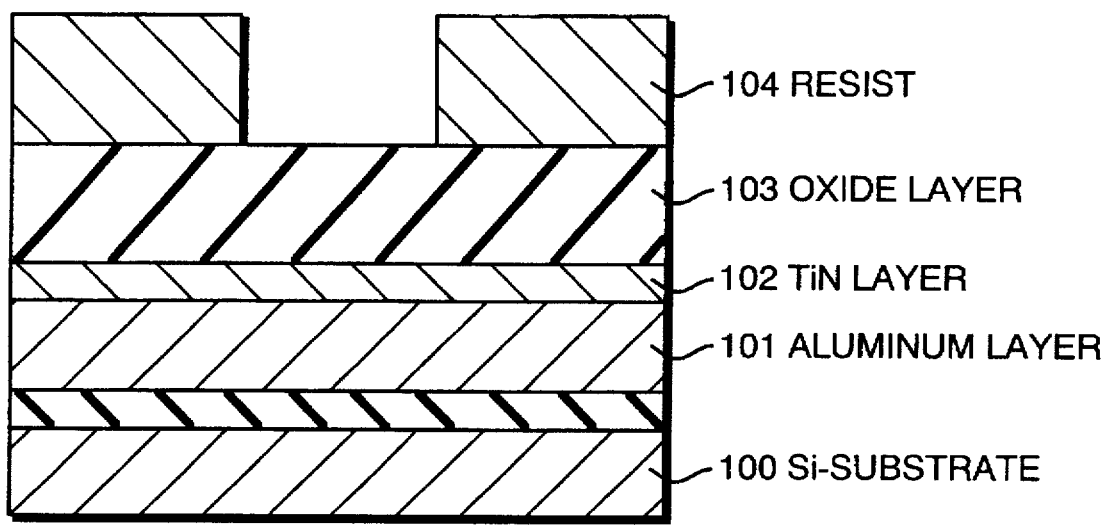
FIGS. 1A and 1B are cross-sectional views showing fabrication process of a conventional method.
Figure 2A:
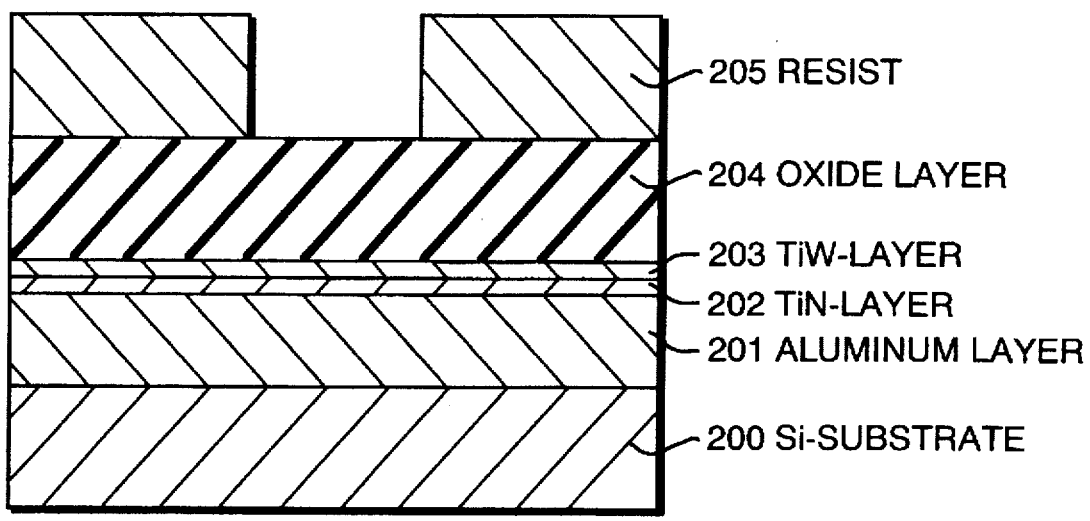
FIGS. 2A and 2B are cross-sectional views showing fabrication process of another conventional method.

For better understanding of the invention, conventional technology is first described. FIGS. 1A and 2A show fabrication steps of a conventional method. In the conventional method, an aluminum layer 101 is formed on an Si substrate 100 to have a thickness of 1 μm, a TiN layer 102 is formed on the aluminum layer 101 to have a thickness of 500 Å, and then the aluminum layer 101 and the TiN layer 102 are patterned to form a first conductive pattern. An oxide layer 103 is formed on the first conductive pattern (101 and 102) as an insulation layer having a thickness of 8000 Å, and then a resist mask 104 is formed on the oxide layer 103 by lithography processing, as shown in FIG. 1A. After that, by dry-etching processing, the oxide layer 103 and the TiN layer 102 are etched with a mask of the resist 104 to form a through-hole 110 selectively.

Figure 1B:
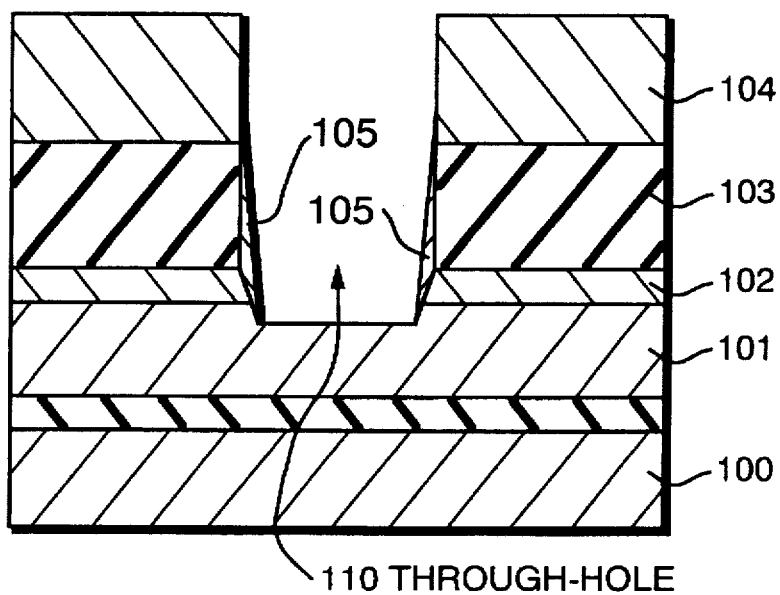

According to the conventional method, as shown in FIG. 1B, deposits 105 of sputtered aluminum or its reaction are stuck on the inside surface of the through-hole 110, the deposits 105 being mainly composed of aluminum, carbon and fluorine. The carbon and fluorine come out from the deposits 105 in formation processing of the conductive layer into the through-hole 110, and therefore, the electrical characteristics of the through-hole 110 becomes worse. Otherwise, if the TiN layer 102 is not etched in formation processing of the through-hole 110, the resistance of the through-hole 110 will be high.

Figure 2B:
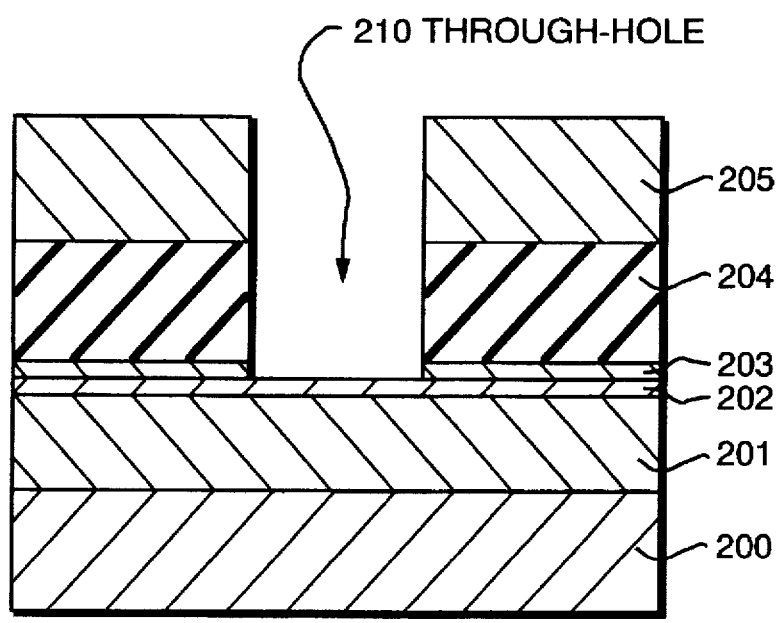

In a publication of Japanese Patent Application, Kokai Showa 62-132359, as shown in FIGS. 2A and 2B, an aluminum layer 201 is formed on an Si substrate 200 to have a thickness of 1 μm, and a TiN layer 202 is formed on the aluminum layer 201 as a barrier to have a thickness of 1000 Å. A TiW (or W) layer 203 is formed as a cap-layer on the TiN layer 202 to have a thickness of 500 Å, then an oxide layer 204 is formed as an insulation on the TiW layer 203 to have a thickness of 8000 Å, and then a resist layer 205 is formed on the oxide layer 204 by lithography processing. After that, the TiN layer 202 and the TiW layer 203 are dry-etched using the resist layer 205 as a mask to form a through-hole 210. The dry-etching is carried out by using fluorine gas, so that the TiW layer 203 is removed, as shown in FIG. 2B. According to this method, the same problems arises as the conventional technology shown in FIGS. 1A and 1B.

FIGS. 3A to 3C show fabrication steps of a first preferred embodiment according to the invention. As shown in FIG. 3A, an oxide layer 302 is formed on an Si substrate 301 by CVD processing, then an aluminum layer 303 is formed on the oxide layer 302 by sputtering processing to have a thickness of 0.5 μm. Next, a TiN layer 304, which is reflection preventing layer, is formed on the aluminum layer 303 to have a thickness of 500 Å, and then the aluminum layer 303 and the TiN layer 304 are patterned to form a first conductive pattern. Next, an oxide layer 305 is formed on the first conductive pattern (303 and 304) as an insulation layer having a thickness of 7000 Å by plasma CVD processing, and then a resist layer 306 is formed on the oxide layer 305 by lithography processing, as shown in FIG. 3A.

After that, the oxide layer 305 is etched by plasma-etching processing using mixed gas of [$C_4F_8$+CO]. The etching processing is carried out with a parallel-flat-plate type of reactive-ion etching apparatus using a high frequency power source of 13.56 Mhz, 600 W. The quantities of gas $C_4F_8$ and CO are 10 sccm and 90 sccm, respectively, and etching pressure is 100 mTorr. In this case, the oxide layer 305 and the TiN layer 304 are etched at 4500 Å/min and 150 Å/min, respectively, that is the selectivity ratio is 30. The etching processing is carried out for two minutes, so that the sufficient TiN layer 304 is remaining, as shown in FIG. 3B.

After the etching of through-hole 310, the TiN layer 304 is etched. The etching is carried out by plasma-etching processing using mixed gas of [$CF_4$+$O_2$]. The etching processing is carried out with a down-flow type of apparatus using a high frequency power source of 13.56 Mhz, 400 W. The quantities of gas $CF_4$ and $O_2$ are 80 sccm and 70 sccm, respectively, and etching pressure is 500 mTorr. In this case, the TiN layer 304 and the aluminum layer 303 are etched at 2500 Å/min and 200 Å/min, respectively. The etching processing is carried out for 15 minutes, so that the TiN layer 304 is removed but the aluminum layer 303 is not substantially etched, as shown in FIG. 3C.

In the above mentioned processing, the TiN layer 304 can be removed after the resist layer 306 has been removed. The TiN layer 304 can be removed by wet-etching using solution of mixture of ammonia and hydrogen peroxide, the ratio of the ammonia and hydrogen peroxide being 1:1, and the solution being diluted by ten times. The wet-etching should be carried out for 5 minutes.

FIGS. 4A to 4C shows fabrication steps of a second preferred embodiment according to the invention. As shown in FIG. 4A, an oxide layer 402 is formed on an Si substrate 401 by CVD processing, then an aluminum layer 403 is formed on the oxide layer 402 by sputtering processing to have a thickness of 0.5 μm. Next, a TiN layer 404, which is a barrier layer, is formed on the aluminum layer 403 to have a thickness of 500 Å, a TiW layer 405, which is a cap-layer, is formed on the TiN layer 404 to have a thickness of 1000 Å, and then the aluminum layer 403, the TiN layer 404 and the TiW layer 405 are patterned to form a first conductive pattern. Next, an oxide layer 406 is formed on the first conductive pattern (403, 404 and 405) as an intermediate insulation layer having a thickness of 7000 Å by plasma CVD processing, and then a resist layer 407 is formed on the oxide layer 406 by lithography processing, as shown in FIG. 4A.

After that, the oxide layer 406 and the TiW layer 405 are etched by plasma-etching processing using mixed gas of [$C_4F_8$+CO] to form a through-hole 410, as shown in FIG. 4B. The etching processing is carried out with a parallel-flat-plate type of reactive-ion etching apparatus using a high frequency power source of 13.56 Mhz, 600 W. The quantities of gas $C_4F_8$ and CO are 10 sccm and 90 sccm, respectively, and etching pressure is 100 mTorr. In this case, the oxide layer 406, the TiN layer 404 and the TiW layer 405 are etched at 4500 Å/min, 150 Å/min and 1000 Å/min, respectively, that is the selectivity ratio between the oxide layer and the TiN layer is 30. The etching processing is carried out for two minutes, so that the sufficient TiN layer 304 is remaining, as shown in FIG. 4B.

After the etching of through-hole 410, the TiN layer 404 is etched. The etching is carried out by plasma-etching processing using mixed gas of [$CF_4$+$O_2$]. The etching processing is carried out with a down-flow type of apparatus using a high frequency power source of 13.56 Mhz, 400 W. The quantities of gas $CF_4$ and $O_2$ are 80 sccm and 70 sccm, respectively, and etching pressure is 500 mTorr. In this case, the TiN layer 404 and the aluminum layer 403 are etched at 2500 Å/min and 200 Å/min, respectively. The etching processing is carried out for 15 minutes, so that the TiN layer 404 is removed but the aluminum layer 403 is not substantially etched, as shown in FIG. 4C. In the above mentioned processing, the TiN layer 404 can be removed after the resist layer 407 has been removed.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A method for fabricating a multilayer semiconductor device, comprising the steps of:

providing a conductive layer on a substrate;

forming a barrier layer on the conductive layer;

forming an insulation layer on the barrier layer;

selectively etching the insulation layer using the barrier layer as an etch stop to form a through-hole; and selectively removing the barrier layer at the bottom of the through-hole from the conductive layer.

2. The method according to claim 1, wherein:

said selective etching is carried out with a dry etching technique at a selectivity of more than ten between the insulation layer and the barrier layer.

3. The method according to claim 2, wherein:

said selective etching is carried out with a dry etching technique at a selectivity of more than twenty between the insulation layer and the barrier layer.

4. The method according to claim 1, wherein:

said barrier layer is selected from the group consisting of TiN, TaN and ZrN.

5. The method according to claim 1, wherein:

said selectively removing the barrier layer is carried out with a chemical dry etching technique using a mixture of oxygen and fluorocarbon gas.

6. The method according to claim 1, wherein:

said selectively removing the barrier layer is carried out with a wet etching technique using a mixture of ammonia and hydrogen peroxide.

7. A method for fabricating a multilayer semiconductor device, comprising the steps of:

providing an aluminum layer on a substrate;

forming a barrier layer on the aluminum layer;

forming a cap-layer on the barrier layer, the cap-layer is selected from the group consisting of TiW and W (tungsten);

forming an insulation layer on the cap-layer;

selectively etching the insulation layer and the cap-layer using the barrier layer as a stopper to form a through-hole; and selectively removing the barrier layer at the bottom of the through-hole from the conductive layer.

8. The method according to claim 7, wherein:

said selectively etching is carried out with a dry etching technique at a selectivity of more than ten between the insulation layer and the barrier layer.

9. The method according to claim 8, wherein:

said selectively etching is carried out with a dry etching technique at a selectivity of more than twenty between the insulation layer and the barrier layer.

10. The method according to claim 7, wherein:
said barrier layer is selected from the group consisting of TiN, TaN and ZrN.

11. The method according to claim 7, wherein:
said selectively removing the barrier layer is carried out with a chemical dry etching technique using a mixture of oxygen and fluorocarbon gas.

12. The method according to claim 7, wherein:
said selectively removing the barrier layer is carried out with a wet etching technique using a mixture of ammonia and hydrogen peroxide.

13. A method for fabricating a multilayer semiconductor device, comprising the steps of:

providing an Si semiconductor substrate;

forming a first insulation layer on the Si semiconductor substrate;

forming an aluminum conductive layer on the first insulation layer;

forming a barrier layer on the aluminum layer, the barrier layer selected from the group consisting of TiN, TaN and ZrN;

forming a second insulation layer on the barrier layer;

forming a resist pattern on the second insulation layer;

selectively etching the second insulation layer using the resist pattern as a mask and the barrier layer as an etch stop form a through-hole thereon; and selectively removing the barrier layer at the bottom of the through-hole from the aluminum layer.

* * * * *